(12) United States Patent
Higgins, Sr. et al.

(10) Patent No.: US 6,984,563 B1
(45) Date of Patent: Jan. 10, 2006

(54) FLOATING GATE SEMICONDUCTOR COMPONENT AND METHOD OF MANUFACTURE

(75) Inventors: Kelley Kyle Higgins, Sr., Austin, TX (US); Ibrahim Khan Burki, Austin, TX (US)

(73) Assignee: FASL LLC, Sunnyvale, CA (US)

( * ) Notice: Subject to any disclaimer, the term of this patent is extended or adjusted under 35 U.S.C. 154(b) by 0 days.

(21) Appl. No.: 10/883,924

(22) Filed: Jul. 1, 2004

(51) Int. Cl.
*H01L 21/336* (2006.01)
(52) U.S. Cl. .................. 438/257; 438/261; 257/315
(58) Field of Classification Search ........... 438/257, 438/261; 257/315
See application file for complete search history.

(56) References Cited

U.S. PATENT DOCUMENTS

| | | | | |
|---|---|---|---|---|
| 5,528,053 A | * | 6/1996 | Schwalke | 438/156 |
| 6,403,494 B1 | * | 6/2002 | Chu et al. | 438/719 |
| 6,429,480 B1 | * | 8/2002 | Koishikawa | 257/317 |
| 6,452,226 B2 | * | 9/2002 | Kawai et al. | 257/315 |
| 6,492,227 B1 | * | 12/2002 | Wang et al. | 438/257 |
| 6,583,009 B1 | | 6/2003 | Hui et al. | |
| 6,642,104 B2 | * | 11/2003 | Chang | 438/257 |
| 2001/0028578 A1 | | 10/2001 | Cunningham | |

* cited by examiner

*Primary Examiner*—Trung Dang
(74) *Attorney, Agent, or Firm*—Paul Drake; Rennie Wm. Dover

(57) ABSTRACT

A semiconductor component having a substantially planar surface on which a film can be deposited and a method for manufacturing the semiconductor component. A layer of dielectric material is formed over a semiconductor substrate and a layer of polysilicon is formed on the layer of dielectric material. The polysilicon layer is patterned to form floating gate structures and expose portions of the layer of dielectric material. Additional dielectric material is formed over the floating gate structures and the exposed portions of the layer of dielectric material. The additional dielectric material is planarized such that it has a surface that is substantially contiguous with and coplanar with the floating gate structures. An oxide-nitride-oxide (ONO) dielectric structure or stack is formed on the surfaces of the floating gate structures and the dielectric material. A layer of polysilicon is formed on the ONO dielectric structure.

21 Claims, 2 Drawing Sheets

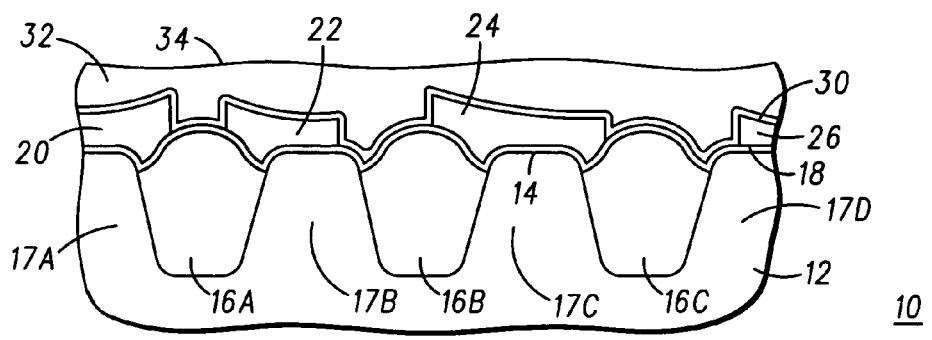
*Fig. 1* —Prior Art—
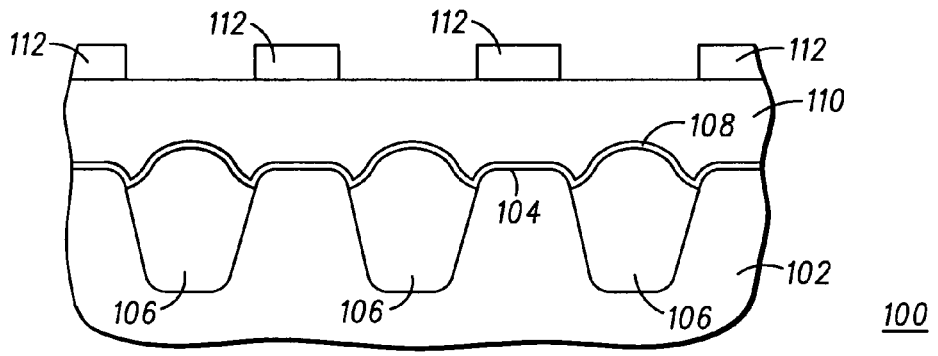
*Fig. 2*
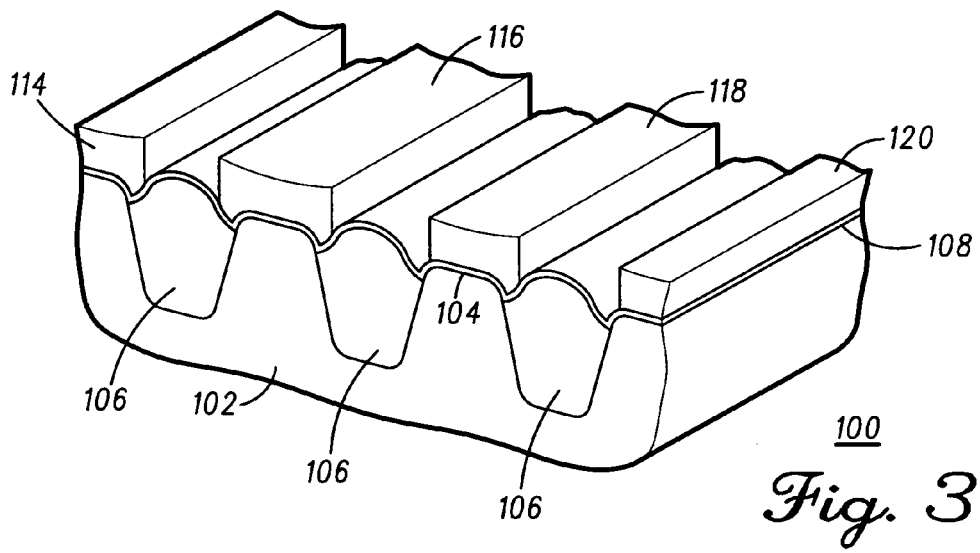
*Fig. 3*

FLOATING GATE SEMICONDUCTOR COMPONENT AND METHOD OF MANUFACTURE

FIELD OF THE INVENTION

The present invention relates, in general, to a semiconductor component and, more particularly, to surface planarity within a semiconductor component.

BACKGROUND OF THE INVENTION

Semiconductor component manufacturers typically make a plurality of semiconductor components from a single semiconductor wafer. The number of integrated circuits that can be manufactured from the single semiconductor wafer ranges from one up to tens of thousands. Because integrated circuits are comprised of transistors or semiconductor devices, one technique for lowering their cost of manufacture is to shrink the transistor sizes, which in turn shrinks the integrated circuit sizes. Manufacturing costs are lowered because more integrated circuits can be manufactured from each semiconductor wafer. Another advantage of shrinking transistor sizes is that their operating speeds increase.

A drawback with shrinking transistors is that the surface of the semiconductor wafer becomes non-planar which may limit the resolution of the photolithography processes used in integrated circuit manufacture. Non-planar surfaces that arise during manufacture can create imperfections such as voids in layers subsequently formed over the non-planar surfaces. Voids degrade integrated circuit performance. FIG. 1 illustrates a portion of a prior art Electrically Erasable and Programmable Read Only Memory ("EEPROM") 10 during an intermediate stage of manufacture. EEPROM 10 comprises a semiconductor substrate 12 having a major surface 14 and Shallow Trench Isolation ("STI") structures 16A, 16B, and 16C. STI structure 16A separates active regions 17A and 17B from each other, STI structure 16B separates active regions 17B and 17C from each other, and isolation structure 16C separates active regions 17C and 17D from each other. A layer of dielectric material 18 is formed on major surface 14. Floating gates 20, 22, 24, and 26 are disposed on portions of dielectric layer 18 and are spaced apart from each other. Preferably, floating gates 20–26 are formed over respective active regions 17A–17D. Because of the small device sizes and the short distance between isolation structures, surface non-planarity may cause floating gates 20–26 to be misaligned. This misalignment decreases the reliability of EEPROM 10.

Floating gates 22 and 26 are shown as being misaligned in FIG. 1 such that floating gate 22 has an edge or side near an edge of isolation structure 16B and floating gate 26 has an edge or side near an edge of isolation structure 16C. An Oxide-Nitride-Oxide ("ONO") dielectric structure 30 is formed on floating gates 20–26. A layer of polysilicon 32 having a surface 34 is disposed on dielectric structure 30. Although not shown for the sake of clarity, it should be understood that polysilicon layer 32 is patterned to serve as a word line of EEPROM 10. The misalignment of floating gate 22 causes a portion of polysilicon layer 32 to be sufficiently close to one edge of floating gate 22 and isolation structure 16B to stress it during operation. Likewise, the misalignment of floating gate 26 causes another portion of polysilicon layer 32 to be sufficiently close to one edge of floating gate 26 and isolation structure 16C to stress it during operation. The increased stress decreases the reliability of the semiconductor component and may result in failure of EEPROM 10.

Accordingly, what is needed is a semiconductor component and method for its manufacture that improves surface planarity and mitigates misalignment of structures such as floating gates.

SUMMARY OF THE INVENTION

The present invention satisfies the foregoing need by providing a floating gate semiconductor component having a planar surface on which a film can be formed and a method for manufacturing the floating gate semiconductor component. In accordance with one aspect, the present invention comprises providing a semiconductor substrate having an active region and an isolation structure. A first layer of dielectric material is formed on the semiconductor substrate. A first layer of semiconductor material is formed over the active region. A portion of the first layer of dielectric material is between the semiconductor substrate and the first layer of semiconductor material. A second layer of dielectric material is formed over the first layer of dielectric material and the isolation structure. The second layer of dielectric material is planarized.

In accordance with another aspect, the present invention comprises a method for manufacturing a memory element comprising providing a semiconductor substrate. A plurality of isolation structures are formed in the semiconductor substrate such that a first active region of the semiconductor substrate is between the first and second isolation structures of the plurality of isolation structures. A first finger of semiconductor material is formed over the first active region and dielectric material is disposed over the first finger and the first and second isolation structures. The dielectric material is planarized to have a substantially planar surface. An electrical isolation material is formed on the substantially planar surface. A layer of semiconductor material is formed over the electrical isolation material.

In accordance with yet another aspect, the present invention comprises a semiconductor component that includes a semiconductor substrate having a first active region between first and second isolation structures of the plurality of isolation structures. A first finger of semiconductor material is disposed over the first active region and a first dielectric material is disposed over the first finger and the first and second isolation structures. A second dielectric material is disposed on the first finger of semiconductor material. A layer of semiconductor material is disposed over the electrical isolation material.

BRIEF DESCRIPTION OF THE DRAWINGS

The present invention will be better understood from a reading of the following detailed description, taken in conjunction with the accompanying drawing figures, in which like reference numbers designate like elements and in which:

FIG. 1 is a cross-sectional side view of a portion of a prior art semiconductor component at an intermediate stage of manufacture;

FIG. 2 is a cross-sectional side view of the a semiconductor component at an early stage of manufacture in accordance with an embodiment of the present invention;

FIG. 3 is an isometric view of the semiconductor component of FIG. 2 at a later stage of manufacture;

DETAILED DESCRIPTION

Figure 4:
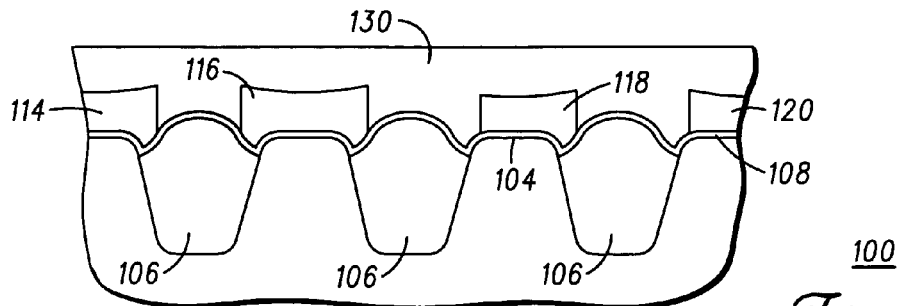
FIG. 4 is a cross-sectional side view of the semiconductor component of FIG. 3 at a later stage of manufacture.

FIG. 2 is a cross-sectional side view of a portion of a semiconductor component 100 during manufacture in accordance with an embodiment of the present invention. What is shown in FIG. 2 is a substrate 102 having a major surface 104 and a plurality of Shallow Trench Isolation (STI) structures 106 formed therein. Techniques for forming STI structures 106 are known to those skilled in the art. Suitable materials for substrate 102 include silicon, silicon germanium, germanium, Silicon-On-Insulator (SOI), and the like. The semiconductor material may also be a semiconductor substrate having an epitaxial layer formed thereon. The conductivity type of substrate 102 is not a limitation of the present invention. In accordance with this embodiment, the conductivity type is chosen to form an N-channel insulated gate semiconductor device or transistor. However, the conductivity type can be selected to form a P-channel insulated gate semiconductor device or a complementary insulated gate semiconductor device, e.g., a Complementary Metal Oxide Semiconductor (CMOS) device. A layer of dielectric material 108 is formed on major surface 104. Dielectric layer 108 serves as a gate dielectric material. By way of example, dielectric layer 108 is formed using thermal oxidation and has a thickness ranging from about 15 Å to about 500 Å.

A layer of polysilicon 110 is formed on dielectric layer 108 using, for example, a chemical vapor deposition technique. A suitable range of thicknesses for polysilicon layer 110 is from about 300 Å to about 2,000 Å. Layer 110 is not limited to being polysilicon. Other suitable materials for layer 110 include amorphous silicon, silicon carbide, gallium arsenide, indium phosphide, and the like. These materials may be monocrystalline or polycrystalline. A layer of photoresist is deposited on polysilicon layer 110 and patterned to form an etch mask layer 112.

Referring now to FIG. 3, an isometric view of semiconductor component 100 is shown further along in processing. Polysilicon layer 110 is etched using an etch chemistry that preferentially etches polysilicon to form polysilicon fingers 114, 116, 118, and 120 on dielectric layer 108. By way of example, polysilicon layer 110 is etched using anisotropic Reactive Ion Etching (RIE). Methods for etching polysilicon are well known to those skilled in the art. After etching, etch mask layer 112 is removed.

Referring now to FIG. 4, a layer of dielectric material 130 having a thickness ranging from about 2500 Å to about 7500 Å is deposited on polysilicon fingers 114–120, and the exposed portions of dielectric layer 108. By way of example, dielectric material 130 is silicon dioxide formed by decomposition of tetraethylorthosilicate.

Figure 5:
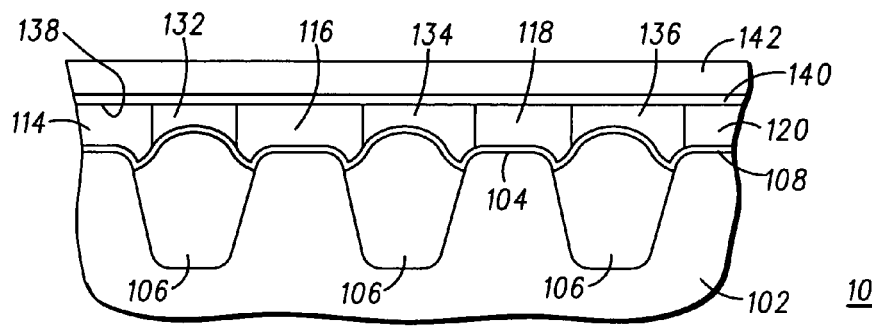
FIG. 5 is a cross-sectional side view of the semiconductor component of FIG. 4 at a later stage of manufacture.

Referring now to FIG. 5, a cross-sectional side view of semiconductor component 100 is shown further along in manufacture. Dielectric material 130 is planarized using, for example, chemical mechanical planarization, leaving dielectric fingers or portions 132, 134, and 136. Portion 132 is between polysilicon fingers 114 and 116, portion 134 is between polysilicon fingers 116 and 118, and portion 136 is between polysilicon fingers 118 and 120. The method of planarizing dielectric material 130 is not a limitation of the present invention. Other suitable planarization techniques include electropolishing, electrochemical polishing, chemical polishing, and chemical enhanced planarization. After planarization, the remaining portions of polysilicon fingers 114–120 and the remaining portions of dielectric material 130, i.e., portions 132, 134, and 136, have a substantially contiguous planar surface 138.

Still referring to FIG. 5, a dielectric material 140 is deposited on surface 138, i.e., the surface formed from the remaining portions of polysilicon fingers 114–120 and portions 132–136 of dielectric material 130. By way of example, dielectric material 140 is an Oxide-Nitride-Oxide (ONO) structure or stack having a thickness ranging from about 100 Å to about 200 Å. A layer of polysilicon material 142 having a thickness ranging from a monolayer of polysilicon to about 300 Å is formed on ONO structure 140. By way of example, polysilicon layer 142 is formed using chemical vapor deposition.

Figure 6:
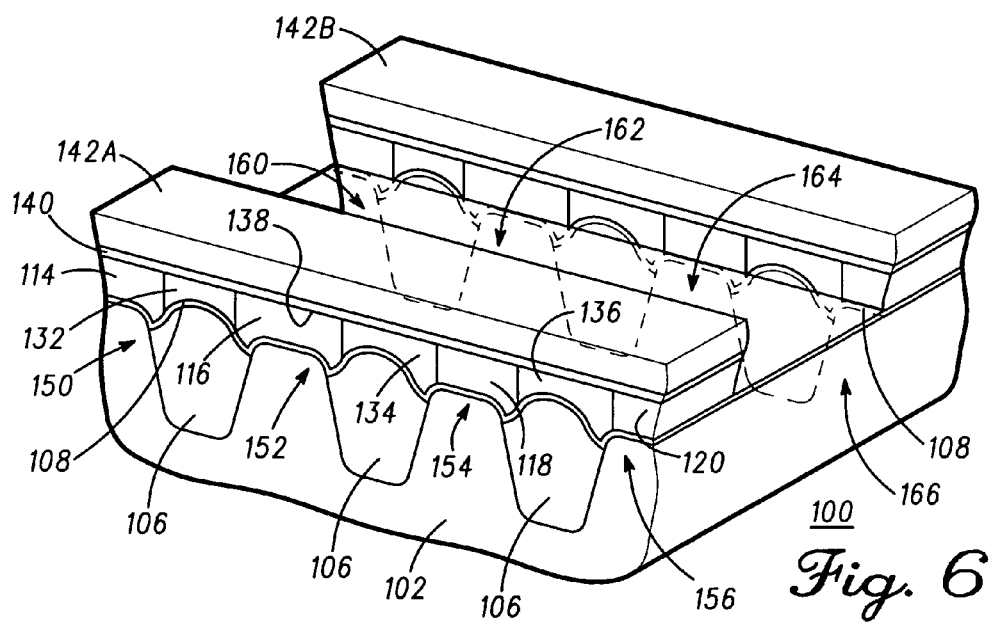
FIG. 6 is an isometric view of the semiconductor component of FIG. 5 at a later stage of manufacture.

Referring now to FIG. 6, an isometric view of semiconductor component 100 is shown further along in processing. A layer of photoresist (not shown) is patterned on polysilicon layer 142 to form an etch mask layer. Polysilicon layer 142, ONO dielectric structure 140, dielectric fingers 132–136, and polysilicon fingers 114–120 are etched, respectively, to form floating gate devices 150, 152, 154, 156, 160, 162, 164, and 166, and word lines 142A and 142B. By way of example, polysilicon layer 142 is etched using anisotropic Reactive Ion Etching (RIE) to form word lines 142A and 142B. After etching polysilicon layer 142, the etch chemistry is modified to etch ONO structure 140. After etching ONO structure 140, the etch chemistry is again modified to etch polysilicon fingers 114, 116, 118, and 120 to form floating gate devices 150, 152, 154, 156, 160, 162, 164, and 166. The etch mask layer is removed and semiconductor component 100 is annealed.

Although not shown, it should be understood that semiconductor component 100 may undergo further processing such as, for example, formation of metal contacts and formation of a metallization system.

By now it should be appreciated that a semiconductor component having floating gates and a method for manufacturing the semiconductor component have been provided. An advantage of the present invention is that the regions between the floating gates is filled with a dielectric material, which can be planarized to form a contiguous planar surface with the surface of the control gates. Thus, films deposited on the contiguous surface are sufficiently separated from the underlying structures to reduce the probability of the semiconductor components failing for reliability reasons. In addition, the dielectric material cooperates with the floating gates to form a planar surface on which subsequent films or material layers can be deposited. The planar surface reduces depth of focus and overlay problems during the photolithographic steps.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a floating gate semiconductor component, comprising:

providing a semiconductor substrate having an active region and an isolation structure;

forming a first layer of dielectric material on the active region and the isolation structure of the semiconductor substrate;

forming a first layer of semiconductor material over the active region and the isolation structure, wherein a first portion of the first layer of dielectric material is between the active region and the first layer of semiconductor material and a second portion of the first layer of dielectric material is between the isolation structure and the first layer of semiconductor material;

forming a second layer of dielectric material on the first layer of dielectric material and over the isolation structure; and planarizing the second layer of dielectric material wherein, after planarizing the second layer of dielectric material, the first portion of the first layer of dielectric material that is between the semiconductor substrate and the first layer of semiconductor material and the second portion of the first layer of dielectric material that is between the isolation structure and the first layer of semiconductor material remain.

2. The method of claim 1, wherein providing the semiconductor substrate includes providing the active region adjacent the isolation structure.

3. The method of claim 1, wherein forming the first layer of semiconductor material includes forming a polycrystalline semiconductor material.

4. The method of claim 1, wherein the polycrystalline semiconductor material is polysilicon.

5. The method of claim 1, wherein providing the semiconductor substrate includes providing first and second active regions and providing the isolation structure between the first and second active regions.

6. The method of claim 5, further including forming a dielectric material on the second layer of dielectric material.

7. The method of claim 6, wherein forming the dielectric material includes forming an oxide-nitride-oxide (ONO) dielectric material on the second layer of dielectric material.

8. The method of claim 6, further including forming a second layer of semiconductor material over the dielectric material.

9. The method of claim 8, wherein the second layer of semiconductor material is polysilicon.

10. The method of claim 1, wherein planarizing the second layer of dielectric material includes using a technique selected from the group of techniques consisting of chemical mechanical planarization, electropolishing, electrochemical polishing, chemical polishing, and chemical enhanced planarization.

11. A method for manufacturing a memory element, comprising:

providing a semiconductor substrate;

forming a plurality of isolation structures in the semiconductor substrate, wherein a first active region of the semiconductor substrate is between first and second isolation structures of the plurality of isolation structures;

forming a first finger of semiconductor material over the first active region and at least the first isolation structure of the plurality of isolation structures;

disposing dielectric material over the first finger of semiconductor material and the first and second isolation structures;

planarizing the dielectric material to have a substantially planar surface, wherein the first finger of semiconductor material over the first active region and at least the first isolation structure of the plurality of isolation structures remains after planarizing the dielectric material;

forming an electrical isolation material on the substantially planar surface; and forming a layer of semiconductor material over the electrical isolation material.

12. The method of claim 11, wherein forming the first finger of semiconductor material comprises:

forming a layer of polysilicon on the first active region and the first and second isolation structures; and patterning the layer of polysilicon using a photolithographic technique to form the first finger of semiconductor material.

13. The method of claim 12, wherein forming the electrical isolation material comprises:

forming a first layer of oxide on the substantially planar surface;

forming a layer of nitride on the layer of oxide; and forming a second layer of oxide on the layer of nitride, wherein the first layer of oxide, the layer of nitride, and the second layer of oxide cooperate to form an oxide-nitride-oxide (ONO) stack.

14. The method of claim 13, wherein forming the layer of semiconductor material on the electrical isolation material includes forming polysilicon on the electrical isolation material.

15. The method of claim 14, wherein forming the finger of semiconductor material further includes forming a layer of dielectric material on the first active region, a portion of the layer of dielectric material between the first active region and the first finger of semiconductor material.

16. The method of claim 11, wherein forming the plurality of isolation structures includes forming a third isolation structure in the semiconductor substrate and a second active region between the second isolation structure and the third isolation structure.

17. The method of claim 16, further including forming a second finger of semiconductor material, the second finger over the second active region.

18. The method of claim 17, wherein forming the first and second fingers of semiconductor material comprises:

forming a layer of polysilicon on the first and second active regions and the first, second, and third isolation structures; and patterning the layer of polysilicon using a photolithographic technique to form the first and second fingers of semiconductor material.

19. The method of claim 18, wherein forming the electrical isolation material comprises:

forming a first layer of oxide on the substantially planar surface;

forming a layer of nitride on the layer of oxide; and forming a second layer of oxide on the layer of nitride, wherein the first layer of oxide, the layer of nitride, and the second layer of oxide cooperate to form an oxide-nitride-oxide (ONO) stack.

20. A semiconductor component, comprising:

a semiconductor substrate having a plurality of isolation structures, wherein a first active region of the semiconductor substrate is between first and second isolation structures of the plurality of isolation structures;

a first finger of semiconductor material disposed over the first active region and the first isolation structure, the first finger of semiconductor material having a surface;

a second finger of semiconductor material disposed over the first active region and the second isolation structure the second finger of semiconductor material having a surface;

a first dielectric material disposed over the active region between the first and second fingers of semiconductor material, the first dielectric material having a surface the surfaces of the first and second fingers of semiconductor material and the surface of the first dielectric material being substantially coplanar;

a second dielectric material disposed on the surfaces of the first and second fingers of semiconductor material and the first dielectric material; and a layer of semiconductor material disposed over the second dielectric material.

21. The semiconductor component of claim 20, wherein the first finger of semiconductor material comprises polysilicon.

* * * * *